(12) United States Patent
Sen et al.

(10) Patent No.: US 6,894,513 B2
(45) Date of Patent: May 17, 2005

(54) MULTIPOINT PLANE MEASUREMENT PROBE AND METHODS OF CHARACTERIZATION AND MANUFACTURING USING SAME

(75) Inventors: Bidyut Sen, Milpitas, CA (US); Sreemala Pannala, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 2 days.

(21) Appl. No.: 10/351,883

(22) Filed: Jan. 27, 2003

(65) Prior Publication Data

US 2004/0145385 A1 Jul. 29, 2004

(51) Int. Cl.[7] .................. G01R 31/26; G01R 27/08
(52) U.S. Cl. .................. 324/719; 324/715; 324/754
(58) Field of Search .................. 324/713–719, 324/754–765, 158.1

(56) References Cited

U.S. PATENT DOCUMENTS 3,134,077 A * 5/1964 Hutchins, IV et al. .......... 330/2
4,758,777 A * 7/1988 Bossard et al. .......... 324/715
5,914,611 A * 6/1999 Cheng .......... 324/719
6,218,846 B1 * 4/2001 Ludwig et al. .......... 324/713

FOREIGN PATENT DOCUMENTS

EP          0 974 845 A1 * 1/2000   .......... G01R/1/073

* cited by examiner

Primary Examiner—Paresh Patel
(74) Attorney, Agent, or Firm—Zagorin O'Brien Graham LLP

(57) ABSTRACT

The present application describes a method and an apparatus for characterizing a conductive plane using multipoint measurement. In an embodiment of the present invention, a known current is injected in the conductive plane using multipoint probes and voltage is measured using multipoint probes. The electrical characteristics of the plane can be determined using the values of the known current, measured voltage and the distance between the probes. In an embodiment of the present invention, the conductive plane is integrated in a semiconductor package of an integrated circuit and the value of the known current is determined based on the actual current that can be provided by the integrated circuit during normal operation.

22 Claims, 7 Drawing Sheets

Current Direction (I1)

Current Direction (I2)

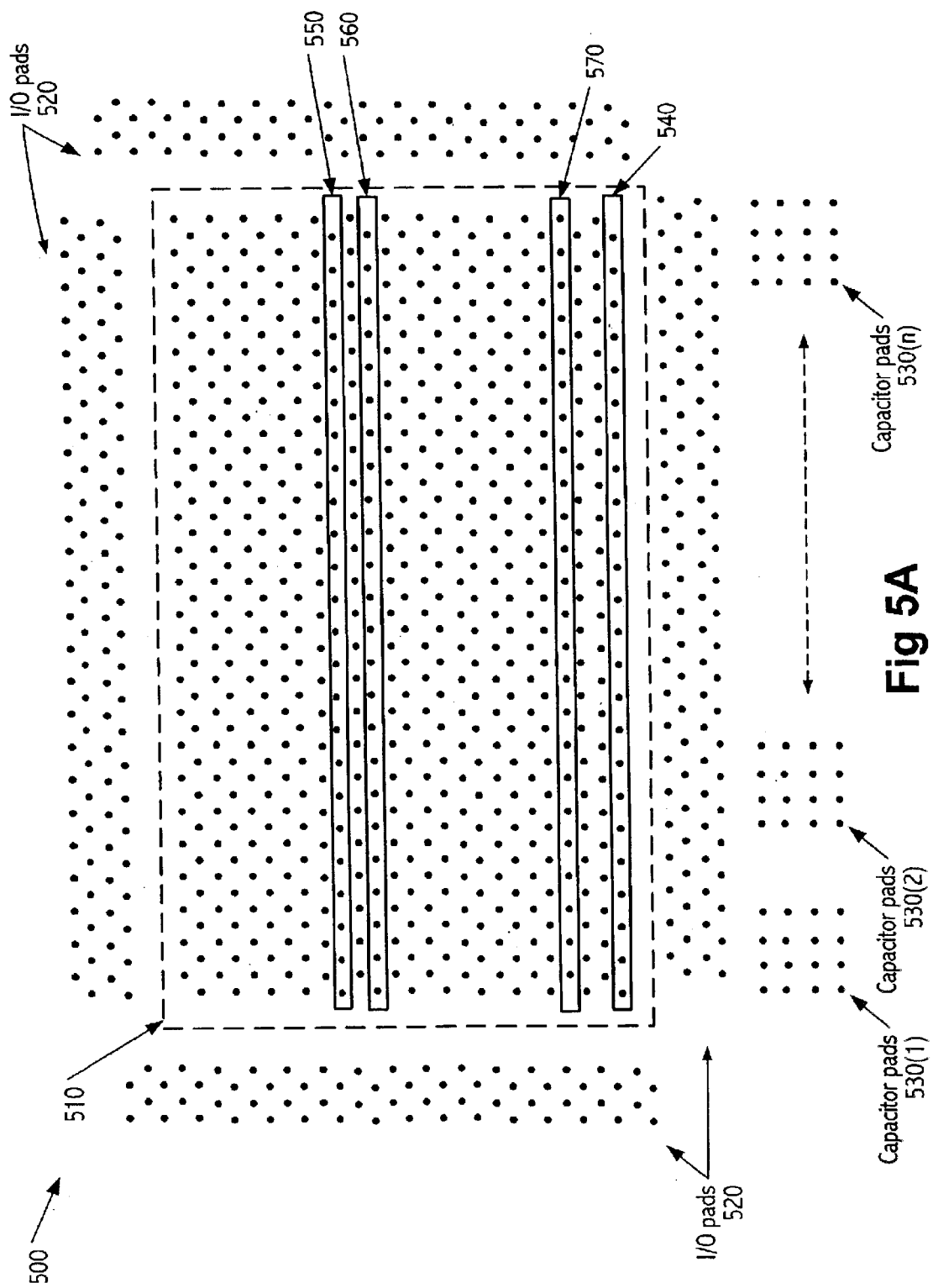

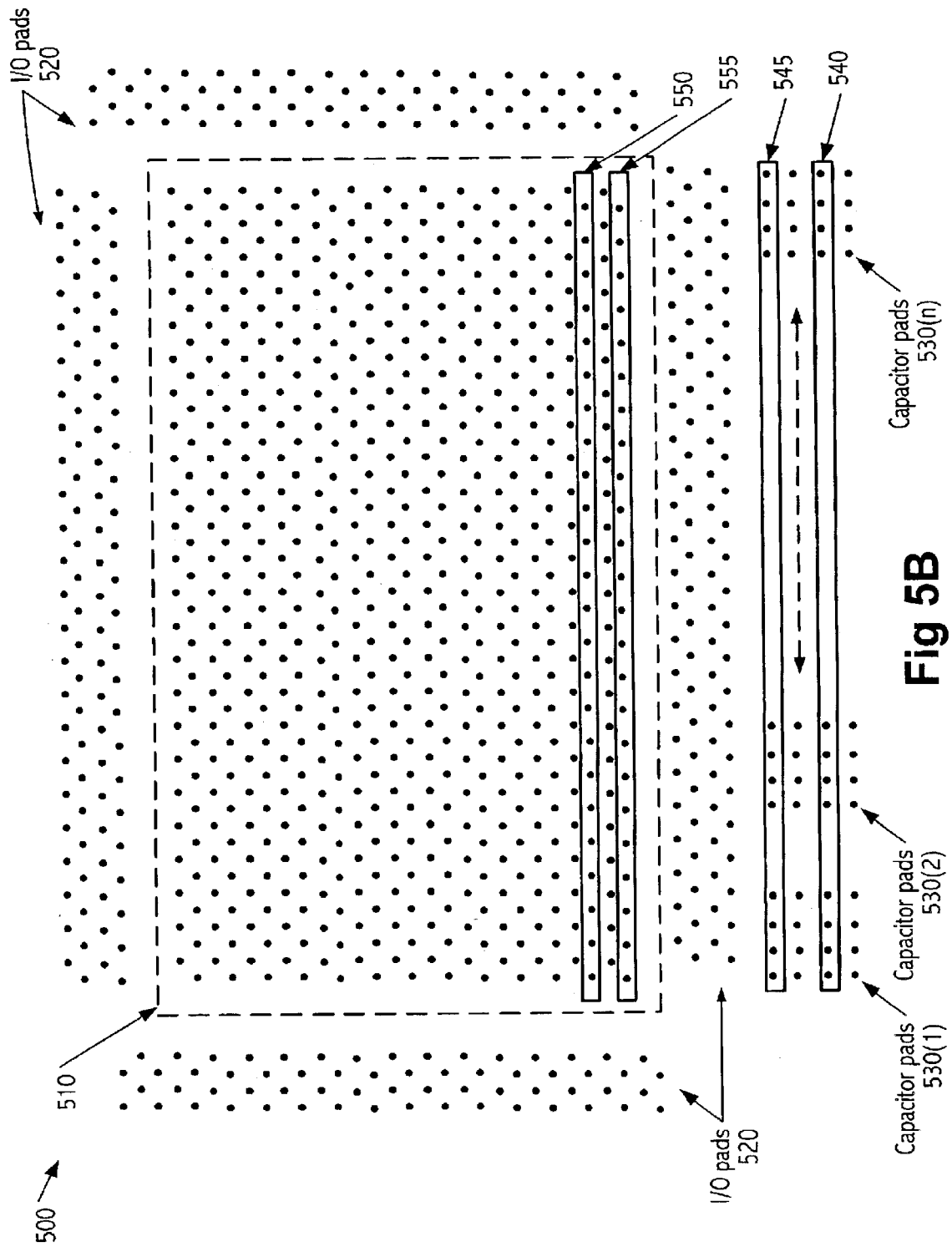

MULTIPOINT PLANE MEASUREMENT PROBE AND METHODS OF CHARACTERIZATION AND MANUFACTURING USING SAME

BACKGROUND

1. Field of the Invention

The present invention relates to characterization of a conductive plane and more specifically to measuring the resistance of the conductive plane using a multipoint measurement probe.

2. Description of the Related Art

Generally, the resistance of a conductive plane is determined based on single point measurement. However, in some cases, single point measurements may provide an incorrect resistance value for the conductive plane. In particular, single point measurements may not be representative of current in cases where spreading is significant.

FIGS. 1A and 1B illustrate two conductive planes (one generally narrower and one generally broader for a given length. FIG. 1A illustrates an example of single point resistance measurement of generally narrower conductive plane 110. The resistance of conductive plane 110 is measured by measuring the voltage across point A and B. A known current I1 flows through conductive plane 110 and current I1 creates a current field 120 in conductive plane 110. The resistance of conductive plane 110 is measured using the voltage across points A and B, known current I1 and the distance between points A and B. The measurement between points A and B do not take into account the spread of known current I1 across conductive plane 110.

FIG. 1B illustrates another example of single point resistance measurement of the generally wider conductive plane 130. The resistance of conductive plane 130 is determined by measuring the voltage across points C and D. A known current I2 flows through conductive plane 130 and creates a current field 140. The resistance of conductive plane 130 is measured using the voltage across points C and D, known current I2 and the distance between points C and D. The measurement between points C and D do not take into account the spread of known current I2 across conductive plane 130. This measurement gives a lower measured value than FIG. 1A measurements even if sheet resistance is the same, due to spreading out of current flow.

Because conventional single point resistance measurement techniques do not take into account the spread of current across the width of conductive planes, measured resistance of a conductive plane (particularly a wide conductive plane) can be inaccurate. Accordingly, conventional measurement techniques do not measure the resistance of conductive planes per square unit for a uniform current. The accurate resistance measurement of conductive plane is important especially, for semiconductor packaging. A semiconductor package for an integrated circuit can include multiple conductive planes providing peripheral contacts for the integrated circuit. Often resistance measurements based on a single pair of points, whatever the source, do not accurately reflect the current spread on the semiconductor package from the integrated circuit die that is placed at the center of the package to the package capacitors on the periphery. Furthermore, such resistance measurements can be particularly vulnerable to variations in localized electrical characteristics of conductive planes as actually fabricated. In general, variations may trace to geometric or process factors. An incorrect resistance measurement of the package can lead to erroneous design of power distribution for the integrated circuit which can severely affect the performance of the integrated circuit.

Techniques are needed to accurately measure the resistance of a conductive plane.

SUMMARY

The present application describes techniques for characterizing a conductive plane using multipoint measurement. In general we cause a known current to flow in a conductive plane and measure voltage using a multipoint probe. The electrical characteristics of the plane can be determined using the values of the known current, measured voltage and the distance between the probes. A variety of multipoint contact configurations and mechanisms for introducing known current flow are described herein.

In some embodiment, the present invention includes a method of characterizing a conductive plane structure. The method includes contacting the plane with a first plurality of generally linearly arranged contacts and with a second plurality of generally linearly arranged contacts, the first and second pluralities of contacts disposed a first distance apart and generally aligned in parallel with respect to each other, causing a known current to flow from the first plurality of contacts to the second plurality of contacts through at least a portion of the plane therebetween, contacting the plane with a third plurality of generally linearly arranged contacts and with a fourth plurality of generally linearly arranged contacts, the third and fourth pluralities of contacts disposed a second distance apart and generally aligned in parallel with respect to each other, and being further disposed inward of the first and second plurality of contacts, measuring a voltage between the third plurality of contacts and the fourth plurality of contacts, and determining an electrical property of the plane using at least the known current, the distance between the third and fourth pluralities of contacts, and the measured voltage.

In some embodiment, the present invention describes a method of designing an integrated circuit device. The method includes measuring electrical characteristics of one or more conductive planes of a package of the integrated circuit using multi-point plane measurement probe and determining decoupling capacitor for the integrated circuit using the electrical characteristics.

In some embodiment, the present invention describes a method of grading integrated circuit packages during manufacturing by characterizing integrated circuit packages using multipoint probes. The integrated circuit packages can be graded based on the performance as affected by the changes in various electrical characteristics of the integrated circuit package. In some variation, a method of grading integrated circuit under various environmental conditions is described.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 5A illustrates an example of measuring resistance of a conductive layer in an integrated circuit package according to an embodiment of the present invention.

FIG. 5B illustrates an example of measuring electrical characteristics of conductive layer 500 for determining decoupling capacitance for the integrated circuit package according to an embodiment of the present invention.

The use of the same reference symbols in different drawings indicates similar or identical items.

DESCRIPTION OF THE PREFERRED EMBODIMENT(S)

Figure 1A:
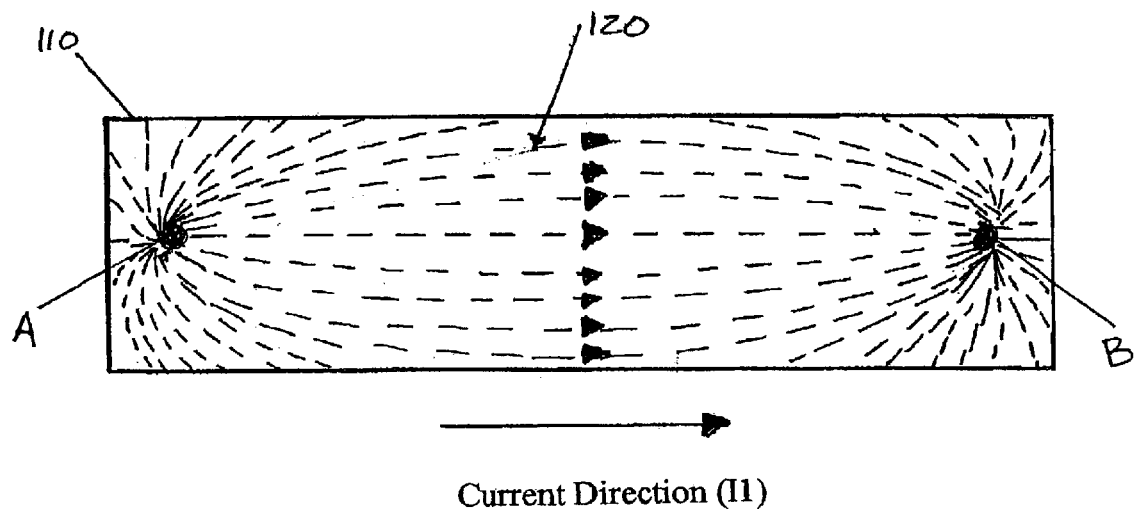
FIG. 1A illustrates an example of single point resistance measurement of a conductive plane with smaller surface area.
Figure 1B:
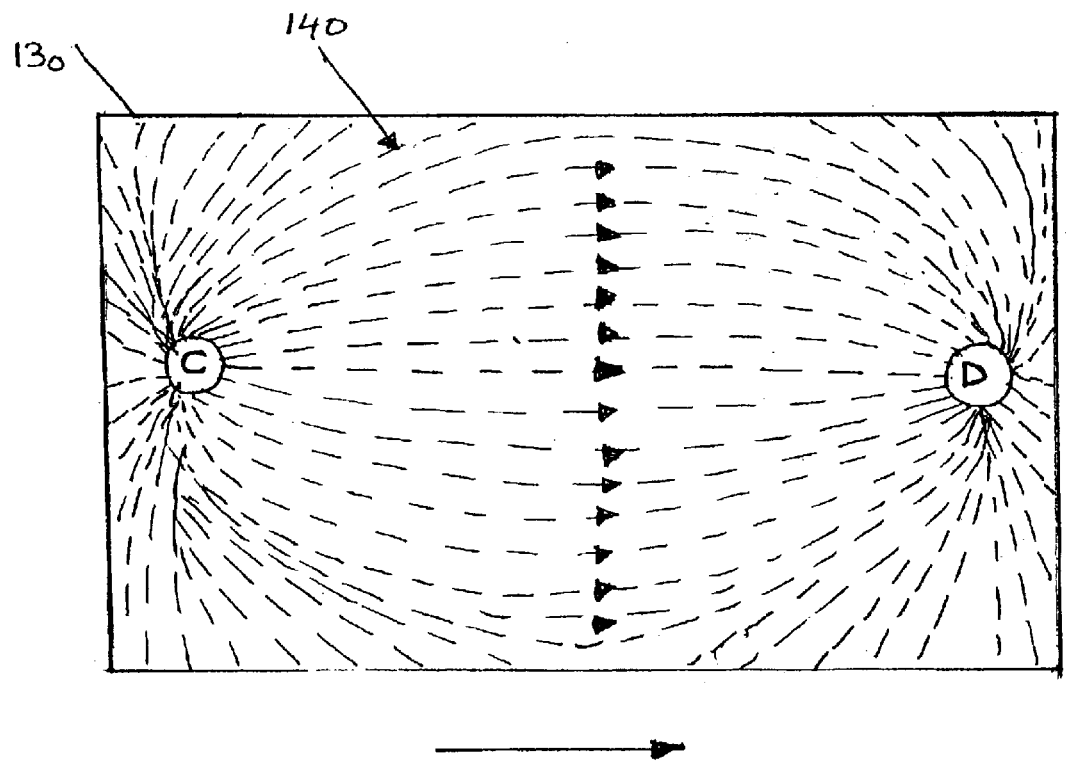
FIG. 1B illustrates an example of single point resistance measurement of a conductive plane with a relatively wider surface area.
Figure 2:
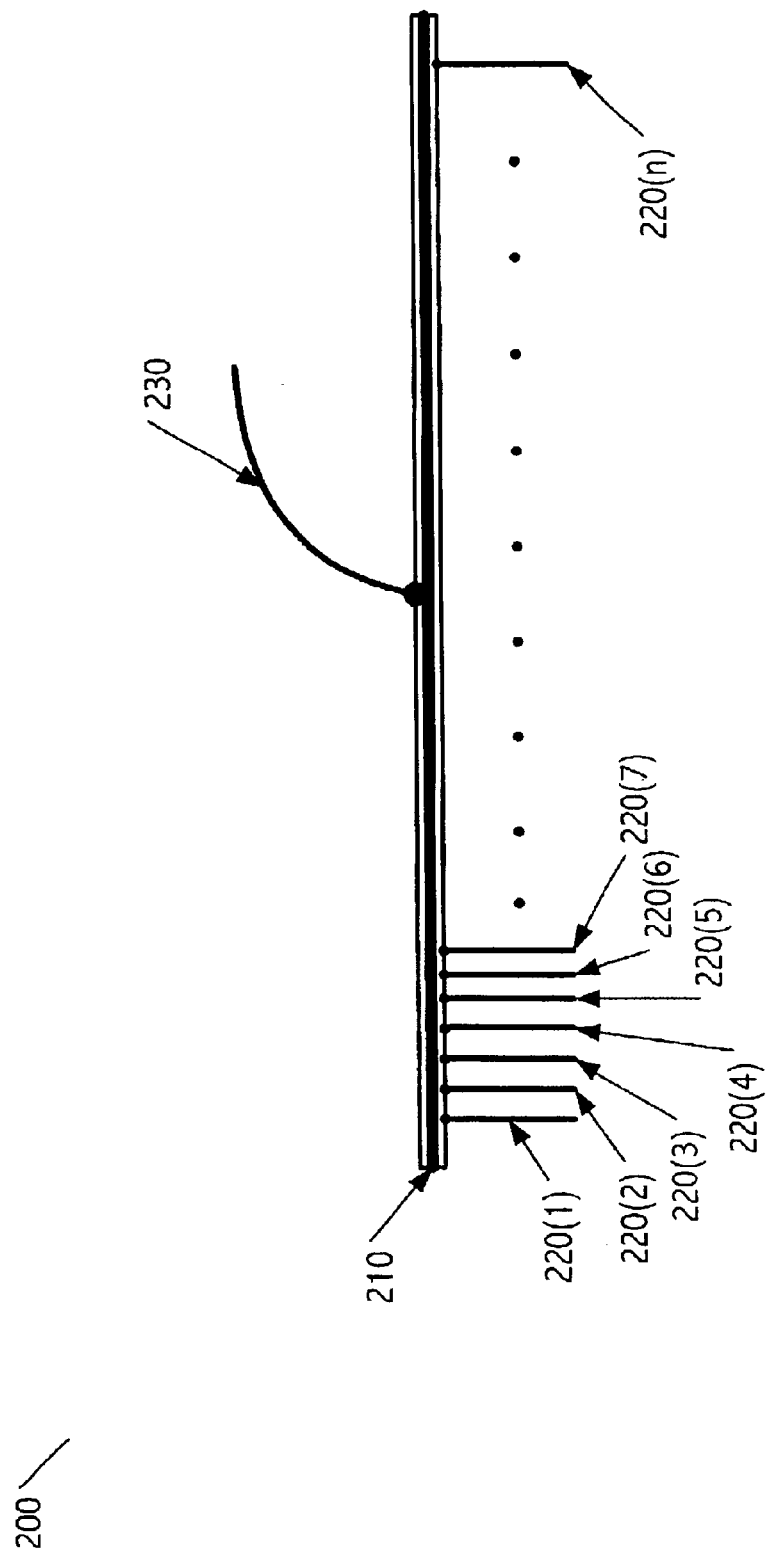
FIG. 2 illustrates an example of a multipoint probe according to an embodiment of the present invention.

FIG. 2 illustrates an example of a multipoint contact 200 that includes a support structure 210 and 'n' conductive pins, pins 220(1)–(n). In general, any of a variety of multipoint contact structures may be employed including pins, conductive tips or edges, springs loaded contacts, pogo pins and the like or combination thereof. In some realizations, support structure 210 can be configured to integrate pins 220(1)–(n) of plural multipoint contacts in a probe card or other similar configuration. The number of pins (e.g., 2, 4, 5, 8 or the like) and the distance between each pin can be adjusted according to the plane under measurement. Pins 220(1)–(n) can be configured to be coupled to each other. In the present example, each pin is coupled to a link 230. Link 230 can be any electrical transmission media (group of individual wires representing each pin, one cable coupling all the pins together or the like). Link 230 can be used to provide electrical parameters (e.g., current, voltage or the like) to pins 220(1)–(n) or read electrical parameters from pins 220(1)–(n) (e.g., current, voltage or the like). Any conventional mechanism can be used to cause multipoint contact 200 to electrically contact respective points or regions of a conductive plane. For example, multipoint contact 200 may be positioned using a micro-manipulator type positioner, a clamp or mechanical holder or positioner or the like.

Figure 3A:
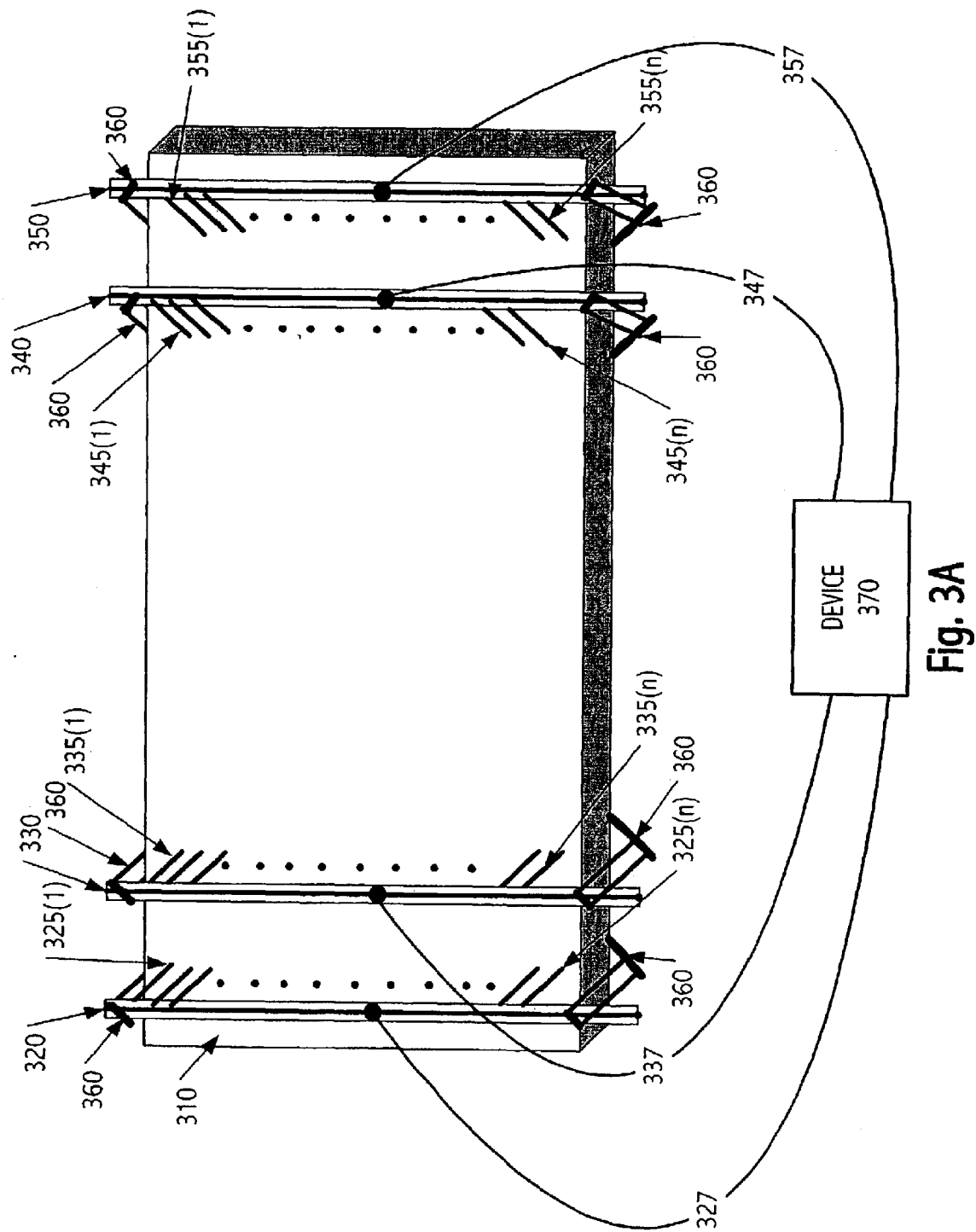
FIG. 3A illustrates an example of characterization of a conductive plane using multipoint probes according to an embodiment of the present invention.

FIG. 3A illustrates an example of characterizing a conductive plane 310 using a multipoint contact. Conductive plane 310 is characterized using four multipoint contacts, 320, 330, 340 and 350. Each multipoint contact includes 'n' pins or other contact structures. For example, multipoint contact 320 includes pins or other contact structures 325(1)–(n), multipoint contact 330 includes pins or other contact structures 335(1)–(n), multipoint contact 340 includes pins or other contact structures 345(1)–(n) and multipoint contact 350 includes pins or other contact structures 355(1)–(n). Each multipoint contact may be placed in electrical contact with conductive plane 310 using positioner (e.g., clamp, mechanical holders, micro-manipulator, or the like) appropriate to hold multipoint contacts in a position so that the pins or other contact structures can be conductively coupled to conductive plane 310. The number of pins or other contact structures and the distance between pins can be adjusted according to the plane under measurement. For example, when multipoint contacts are used to characterize a conductive plane of an integrated circuit then the distance between pins or other contact structures can be smaller (e.g., in micrometer and millimeter range or the like) to allow multipoint measurement.

Each multipoint contact is coupled to a device 370. For example, multipoint contact 320 is coupled to device 370 via a link 327, multipoint contact 330 is coupled to device 370 via a link 337, multipoint contact 340 is coupled to device 370 via a link 347 and multipoint contact 350 is coupled to device 370 via a link 357. Device 370 can be any device (e.g., programmable computer, ohm meter, LCR meter, simulator or the like) capable of determining electrical characteristics (e.g., current, voltage, resistance, inductance or the like) of plane 310. While for purposes of illustration, in the present example, device 370 is an independent device, one skilled in the art will appreciate that device 370 can be integrated with multipoint contacts in a multipoint characterization station including a positioning/contacting mechanism.

For purposes of illustration, in the present example, multipoint contact 320 and 350 are used to cause or force current to flow in conductive plane 310. The current can be a DC current or an AC current. Multipoint contacts 330 and 340 are used to measure voltage (e.g., DC voltage or AC voltage). Device 370 causes a known current to flow in conductive plane 310 using multipoint contacts 320 and 350 and reads voltage across multipoint contacts 330 and 340. Device 370 computes the electrical characteristics (e.g. resistance, inductance or the like) of conductive plane 310. According to an embodiment of the present invention, device 370 is configured to simulate various operating conditions of conductive plane 310 and cause appropriate current flows in conductive plane 310 at appropriate points in plane 310 to determine characteristics of conductive plane 310 under such operating conditions.

Figure 3B:
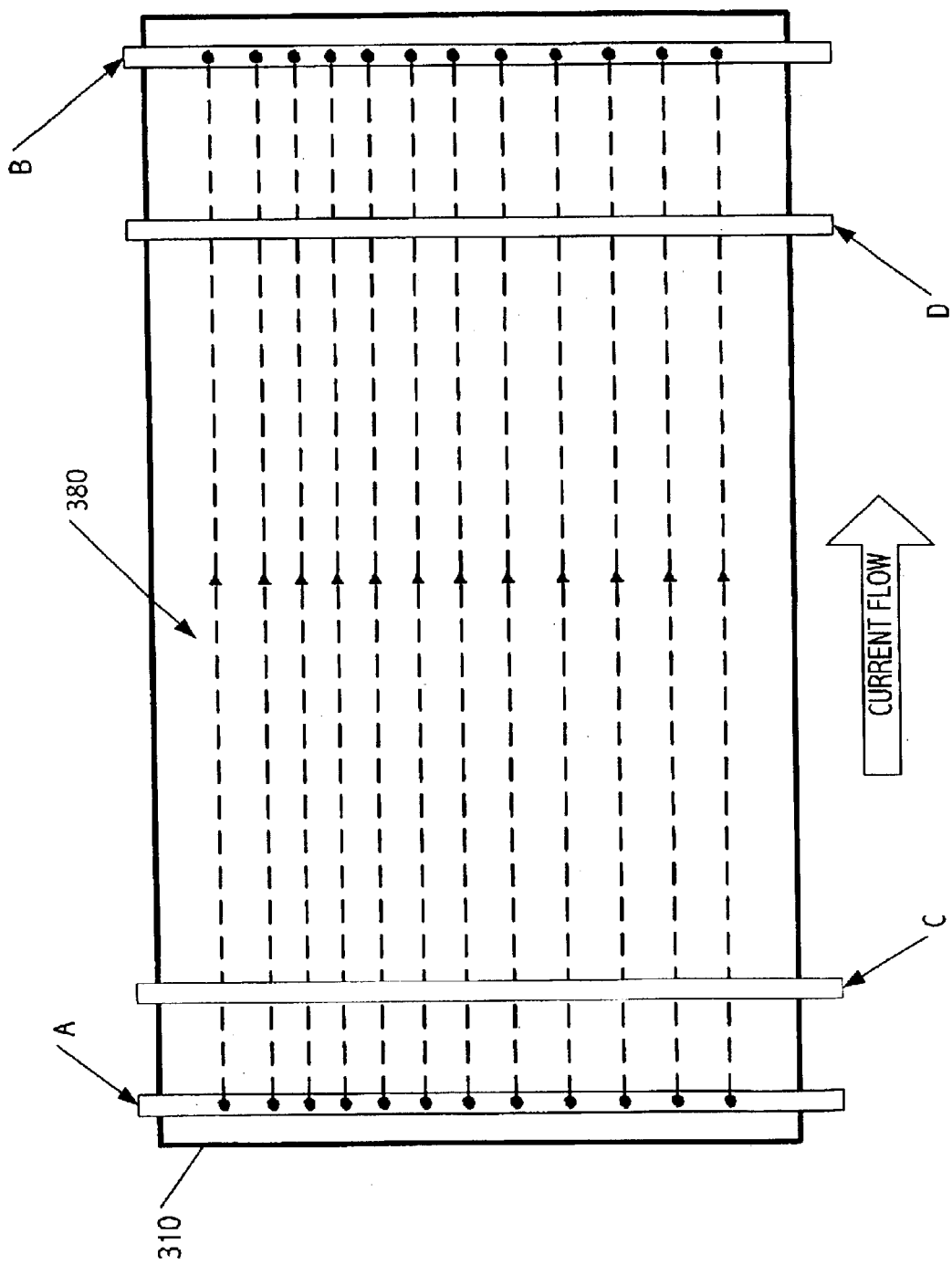
FIG. 3B illustrates an example of current fields in a conductive plane according to an embodiment of the present invention.

FIG. 3B illustrates an example of current fields in conductive plane 310 according to an embodiment of the present invention. When current is introduced in conductive plane 310 (e.g., using a setup such as shown and described above) between contacts 'A' and 'B' then the current field 380 is generated in conductive plane 310. Current field 380 is uniform due to the spacing of the multipoint probes across substantially the entire width of the plane. This enables the measurement of electrical characteristics under such uniform current conditions. When a voltage is read (e.g., using a setup such as shown and described above) across contacts 'C' and 'D' then the electrical characteristics (e.g. resistance, inductance or the like) of conductive plane 310 can be determined.

While contacts A, B, C and D are each illustrated in a linear arrangement, some or all of the contacts may be arranged in a less than precisely-linear arrangement while still providing substantial advantages. Accordingly, such contacts may be generally-linearly arranged i.e., arranged in a manner that, in aggregate, preserves the desired uniformity of current flow (and sampling thereof) despite certain regular or irregular variations in placement of individual connection points or regions of a given multipoint contact. For example, even slightly staggered arrangements of contact points may provide a suitable generally-linear arrangement in some applications.

Because the current field 380 is uniform in conductive plane 310 due to the multipoint contacts, the per-square unit characteristics (e.g., resistance per square unit or the like) can be accurately measured. The measurement of characteristics per square unit is useful especially, for semiconductor packaging. For example, the resistance per square unit for a ceramic semiconductor package (e.g., Alumina/ Tungsten or the like) is worse than narrow line resistance. This can be due to the metal thickness variations in the packaging process. Alternatively or additionally voids or other discontinuities in the conductive plane (whether for vias or other structures or arising from variations or tolerances in fabrication process) may affect local conductivity and for current flow. Thus, it is important to accurately measure resistance per square unit of the semiconductor package to properly design the power distribution for the integrated circuit encompassed by the semiconductor package.

Figure 4:
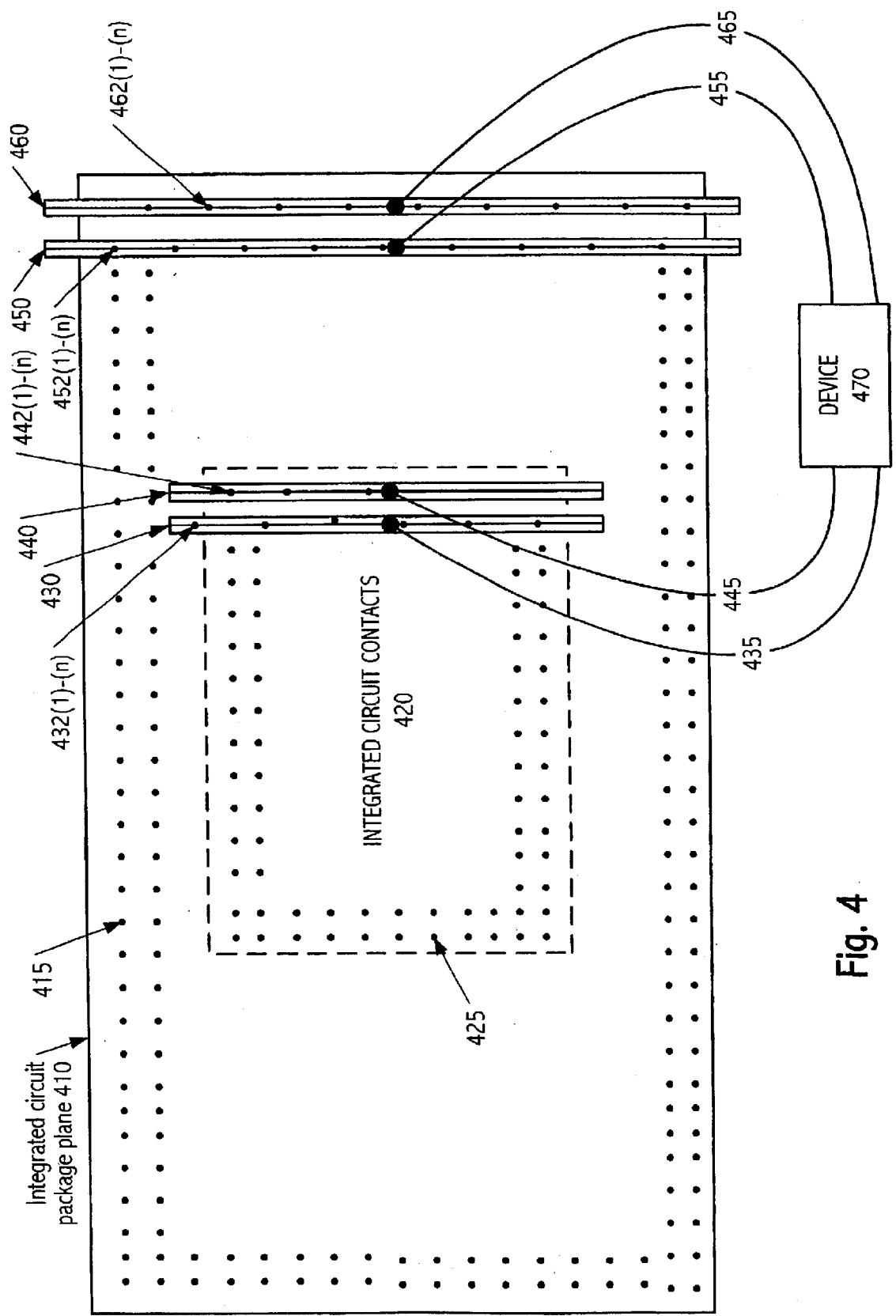
FIG. 4 illustrates an example of multipoint probe application for measuring per square unit characteristic of an integrated circuit package plane according to an embodiment of the present invention.

FIG. 4 illustrates an example of multipoint contact application for measuring per square unit characteristic of an integrated circuit package plane 410 according to an embodiment of the present invention. Integrated circuit package plane 410 includes conductive pads 415 on the periphery. Conductive pads 415 can be used for bypass capacitors and/or for connecting to a conductor external to the package. Integrated circuit package plane 410 further includes integrated circuit contacts 420. Integrated circuit contacts 420 are contacts of an integrated circuit that can be encompassed by integrated circuit package plane 410. Integrated circuit contacts 420 include conductive pads 425. Conductive pads 425 provide conductive paths for the integrated circuit to integrated circuit package plane 410. For purposes of illustrations, in the present example, one conductive plane for the integrated circuit package is shown however, one skilled in art will appreciate that integrated circuit package can include multiple conductive planes.

In the present example, the multipoint probe includes four multipoint contacts 430, 440, 450 and 460 that are used to measure electrical characteristics of integrated circuit package plane 410. Multipoint contacts further include 'n' pins or other appropriate contact structures and are coupled to a device 470. Device 470 can be any device (e.g., programmable computer, ohm meter, LCR meter, simulator or the like) capable of determining electrical characteristics of integrated circuit package plane 410 (e.g., current, voltage, resistance, inductance or the like). For example, multipoint contact 430 includes pins 432(1)–(n) and is coupled to device 470 via a link 435, multipoint contact 440 includes pins 442(1)–(n) and is coupled to device 470 via a link 445, multipoint contact 450 includes pins 452(1)–(n) and is coupled to device 470 via a link 455 and multipoint contact 460 includes pins 462(1)–(n) and is coupled to device 470 via a link 465. Individual contact points of multipoint contact 430 and 440 coincide with corresponding conductive pads 425 of integrated circuit contacts 420.

While, for purposes of illustrations, in the present example, individual contact structures of a multipoint probe are shown, these multipoint contacts can be combined into one structure. For example, contacts 430 and 440 can be combined into one structure. Similarly, contacts 450 and 460 can be combined into one structure or all four contacts can be combined into one structure such as a probe card. Also, the pins in each contacts are shown substantially aligned in parallel, however, depending upon the surface under measurement (e.g., non-uniform plane, plane with voids or the like), these pins can be rearranged for appropriate measurement. Generally, the pins can be aligned linearly to provide appropriate conductive coupling with non-uniform planes.

The individual contacts of a multipoint probe configuration are placed at pads that can provide current under operating conditions from the integrated circuit. For example, multipoint contacts 450 and 460 are placed on conductive pads 415 at the periphery of integrated circuit package plane 410. Multipoint contacts can be placed on conductive pads 425 using any mechanism (not shown). In the present example, device 470 drives a current between multipoint contacts 430 and 460. The amount of current can be same as it would be under operating conditions thus simulating the operating conditions of the integrated circuit. Device 470 measures voltage across multipoint contacts 440 and 450.

Using other known factors (i.e., e.g., value of the current, voltage measured, distance across the multipoint contacts or the like) device 470 characterizes integrated circuit package plane 410 (e.g., computes resistance per square unit or the like). When integrated circuit package plane 410 is characterized and specific electrical parameters are known, the design of the integrated circuit can be adjusted for appropriate power distribution for the integrated circuit. For example, characterizing the conductive planes of an integrated circuit package plane can be used to determine the size of a decoupling capacitor or the like for the packages during the design phase. While the characterization of one integrated circuit package plane is shown, one skilled in art will appreciate that the electrical parameter measurement can be done for multiple planes.

FIG. 5A illustrates an example of measuring resistance of a conductive layer 500 in an integrated circuit package according to an embodiment of the present invention. For purposes of illustrations, in the present example, conductive layer 500 is an outer layer of the integrated circuit package. Conductive layer 500 includes pads 510 for connecting integrated circuit and input/output pads 520 for peripheral connection of the integrated circuit. The integrated circuit package includes capacitor pads 530(1)–(n) for package capacitors. In the present example, four-by-four capacitor pads are shown however one skilled in the art will appreciate that capacitor pads can be configured according to the configuration of multi-terminal package capacitors used in a particular implementation. Further, the number of package capacitors and input/output pads can be determined according to the particular application.

In the present example, the multipoint probe includes four multipoint contacts 540, 550, 560 and 570 that are used to measure electrical characteristics of conductive layer 500 from the center of conductive layer 500 to the edge of the integrated circuit package core. Multipoint contacts further include 'n' pins or other appropriate contact structures and can be coupled to a device (e.g., such as shown and described above) capable of determining electrical characteristics of conductive layer 500 (e.g., current, voltage, resistance, inductance or the like). The individual contacts of a multipoint probe configuration are placed at pads that can provide current under operating conditions from the integrated circuit. The amount of current can be same as it would be under operating conditions thus simulating the operating conditions of the integrated circuit.

FIG. 5B illustrates an example of measuring electrical characteristics of conductive layer 500 for determining decoupling capacitance for the integrated circuit package according to an embodiment of the present invention. In the present example, multipoint contacts 540 and 545 are placed on capacitor pads 530 and multipoint contacts 550 and 555 are placed on the integrated circuit pads that are at the periphery of the package. Using the known factors (e.g., value of the current, measured voltage, distance across the multipoint contacts or the like) the characteristics (e.g., resistance per square unit or the like) of conductive plane 500 can be determined. The characteristics and specific electrical parameters can be used to determine the size of a decoupling capacitor during the design phase of the integrated circuit. While the characterization of one integrated circuit package plane is shown, one skilled in art will appreciate that the electrical parameter can be measured for multiple planes.

According to an embodiment of the present invention, the multipoint contacts can be used to characterize and grade integrated circuits during manufacturing. For example, electrical characteristics of conductive planes in the integrated circuits can be determined using multipoint contacts to determine the power distribution of the integrated circuits. As described herein, the power distribution in the integrated circuits can affect the performance of the integrated circuits. Thus, the integrated circuits can be graded (e.g., high performance integrated circuit, low performance integrated circuit or the like) by estimating the performance of the integrated circuits based on the power distribution determined using the multipoint contacts. Similarly, the characterization of conductive planes of the integrated circuits can be used to determine the sensitivity of the integrated circuit package to the changes in various electrical characteristics (e.g., resistance, total current, differences in voltages (e.g., 5 volts, 1.3 volts or the like) or the like).

According to an embodiment of the present invention, packaged semiconductor integrated circuits are manufactured using multipoint measurement probes. A sample of integrated circuit packages from a package lot is tested using the multipoint probe to determine the electrical characteristics (e.g., plane resistance or the like) of each package. Each one of the package is graded based on the measured electrical characteristic (e.g., resistance or the like) and the integrated circuits are packaged according to the grading. For example, packages having similar or a predetermined range of electrical characteristics (e.g., package resistance below a certain threshold, sensitivity of the package to the resistance or the like or combination thereof) can be graded similar. The grading of the package can be based on particular applications of the integrated circuit (e.g., packages having a relatively low resistance may be suitable for one application and packages having relatively higher resistance may be suitable for other application or the like).

In another embodiment of the present invention, the integrated circuits can be graded based on the estimated performance changes due to the changes in the operating environment. For example, the conductive planes of the integrated circuits can be tested under various environmental conditions (e.g., temperature, humidity or the like or combination thereof) using multipoint contacts to determine the performance of the integrated circuits in such operating condition and grade the integrated circuits accordingly (e.g., based on certain temperature, operating humidity or the like or combination thereof). Similarly, one skilled in the art will appreciate that the characterization of conductive planes of the integrated circuits using multipoint contacts can be used for other integrated circuit manufacturing processes as well.

While particular embodiments of the present invention have been shown and described, it will be apparent to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims.

What is claimed is:

1. A method comprising the steps of:
   contacting a conductive plane with a first plurality of generally linearly arranged contacts and with a second plurality of generally linearly arranged contacts, said first and second pluralities of contacts disposed a first distance apart and generally aligned in parallel with respect to each other;
   causing a known current to flow from the first plurality of contacts to the second plurality of contacts through at least a portion of the plane therebetween;
   contacting the plane with a third plurality of generally linearly arranged contacts and with a fourth plurality of generally linearly arranged contacts, said third and fourth pluralities of contacts disposed a second distance apart and generally aligned in parallel with respect to each other, and being further disposed inward of the first and second plurality of contacts;
   measuring a voltage between the third plurality of contact pins and the fourth plurality of contact pins; and
   determining an electrical property of the plane using at least the known current, the second distance, and the measured voltage.

2. The invention as in claim 1, wherein:
   the conductive plane is integral with an integrated circuit package;
   one plurality of the third and fourth plurality of contact pins is arranged to contact the plane at locations where an integrated circuit would contact the plane; and
   the other plurality of the third and fourth plurality of contact pins is arranged to contact the plane at locations where other electrical connections would contact the plane.

3. The invention as in claim 1, wherein:
   the conductive plane is integral with an integrated circuit package;
   one plurality of the first and second plurality of contact pins is arranged to contact the plane at locations where an integrated circuit would contact the plane; and
   the other plurality of the first and second plurality of contact pins is arranged to contact the plane at locations where other electrical connections would contact the plane.

4. The invention as in claim 2, wherein said locations where other electrical connections would contact the plane comprise:
   a location for attaching a bypass capacitor to the integrated circuit package.

5. The invention as in claim 2, wherein said locations where other electrical connections would contact the plane comprise:
   a location for connecting the plane to a conductor external to the package.

6. The invention as in claim 1, wherein:
   the known current is a DC current; and
   the measured voltage is a DC voltage.

7. The invention as in claim 6, wherein the electrical property of the plane is a DC resistance of the plane.

8. The invention as in claim 1, wherein
the known current is an AC current; and
the measured voltage is an AC voltage.

9. The invention as in claim 1, wherein:
each of the first and second plurality of contact pins includes at least 4 such contact pins.

10. The invention as in claim 1, wherein:
each of the first and second plurality of contact pins includes at least 8 such contact pins.

11. The invention as in claim 1, wherein:
the generally linear arrangement of the first plurality of contact pins has a length at least as long as the first distance between the first plurality of contact pins and the second plurality of contact pins.

12. The method of claim 1 wherein the conductive plane is integral with an integrated circuit package.

13. The method of claim 12 further comprising the steps of:
selecting an integrated circuit having a characteristic suitable for use with the integrated circuit package having a determined electrical property of the conductive plane; and
assembling the selected integrated circuit into the integrated circuit package.

14. The method as in claim 13 wherein the selected integrated circuit comprises a processor type circuit having at least 20 power or ground connections to the measured plane within the package.

15. The method of claim 13 further comprising the step of:
selecting another integrated circuit having a characteristic suitable for use with the first-mentioned integrated circuit package; and
assembling the second selected integrated circuit into another integrated circuit package chosen from a package lot including the first-mentioned integrated circuit package.

16. The method of claim 15 wherein said determined electrical property comprises a resistance of the conductive plane which is less than a certain value.

17. The method of claim 12 further comprising the steps of:
analogously testing at least a sample of packages from a package lot including the first-mentioned package to measure a plane resistance within each package of the sample; and
grading the package lot according to measured plane resistance of the sample.

18. The method of claim 17 further comprising the steps of:
selecting integrated circuits suitable for use with a package lot having at least a certain grade; and
assembling one of the selected integrated circuits into a package from the package lot having at least the certain grade.

19. The method as in claim 18 wherein the selected integrated circuits each comprises a processor type circuit having at least 20 power or ground connections to the measured plane within the package.

20. The method of claim 12 further comprising determining a size of decoupling capacitor for said integrated circuit package using said electrical property determined for the conductive plane of the integrated circuit package.

21. The method of claim 20 further comprising assembling an integrated circuit into the integrated circuit package.

22. The method of claim 21 further comprising assembling a decoupling capacitor having the determined size into the integrated circuit package.

* * * * *